(12) United States Patent
Malone et al.

(10) Patent No.: US 6,898,219 B2
(45) Date of Patent: May 24, 2005

(54) APPARATUS AND METHOD FOR VCSEL MONITORING USING SCATTERING AND REFLECTING OF EMITTED LIGHT

(75) Inventors: Kevin Malone, Boulder, CO (US); Jeffrey Scott, Carpinteria, CA (US); Dale Isaacson, Idaho Springs, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 09/967,433

(22) Filed: Sep. 28, 2001

(65) Prior Publication Data

US 2002/0071459 A1 Jun. 13, 2002

Related U.S. Application Data

(60) Provisional application No. 60/236,684, filed on Sep. 29, 2000.

(51) Int. Cl.[7] .................................................. H01S 3/13
(52) U.S. Cl. ...................... 372/29.02; 372/43; 372/44; 372/45; 372/46; 372/47; 372/48; 372/49; 372/50; 372/99; 372/101; 385/49; 385/88; 385/89; 385/92
(58) Field of Search ............................. 372/29.02, 99, 372/43–50, 101; 385/49, 88, 89, 92

(56) References Cited

U.S. PATENT DOCUMENTS

| | | | |
|---|---|---|---|
| 4,329,659 A | 5/1982 | Chen | 372/29 |
| 5,668,902 A | 9/1997 | Kurata | 385/38 |
| 5,867,622 A | 2/1999 | Miyasaka et al. | 385/88 |
| 5,953,477 A * | 9/1999 | Wach et al. | 385/115 |
| 6,001,664 A * | 12/1999 | Swirhun et al. | 438/31 |
| 6,081,638 A | 6/2000 | Zhou | 385/31 |
| 6,243,508 B1 * | 6/2001 | Jewell et al. | 385/14 |
| 6,392,256 B1 * | 5/2002 | Scott et al. | 257/184 |
| 6,435,734 B2 * | 8/2002 | Okada et al. | 385/88 |

OTHER PUBLICATIONS

Encyclopeida Britannica Online (Website, Internet).p. 1.*

* cited by examiner

*Primary Examiner*—Don Wong
*Assistant Examiner*—Delma R. Flores Ruiz
(74) *Attorney, Agent, or Firm*—Barlow, Joseph & Holmes, Ltd.

(57) ABSTRACT

An apparatus and method for monitoring the optical output of vertical cavity surface emitting lasers (VCSELS) utilizes a portion of light emitted by the VCSEL and scatters and/or reflects this portion of emitted light so that it is directed towards a detecting surface of a photodetector. In one embodiment, scattering elements may be incorporated within the epoxy or other coupling medium used to couple the VCSEL to the optical fiber. In another embodiment, the VCSEL may be coupled to an optical fiber secured within a ferrule which has an end surface capable of reflecting or scattering light and directing the light towards the photodetector. In another embodiment, a reflective integrating member may be alternatively or additionally used to reflect a portion of the emitted light to the photodetector. The photodetector, in conjunction with electrical circuitry to which it is coupled, develops an electrical signal which may be provided to laser control means to control and adjust the optical output of the VCSELs.

44 Claims, 4 Drawing Sheets

APPARATUS AND METHOD FOR VCSEL MONITORING USING SCATTERING AND REFLECTING OF EMITTED LIGHT

CROSS-REFERENCE TO RELATED APPLICATION

This application claims priority of U.S. provisional application Ser. No. 60/236,684 entitled "Apparatus and Method for VCSEL Monitoring Using Scattering and Reflection of Emitted Light", filed Sep. 29, 2000, the contents of which are herein incorporated by reference.

FIELD OF THE INVENTION

The present invention relates most generally to vertical cavity surface emitting lasers (VCSELs). More particularly, the present invention is directed to an apparatus and method for monitoring the optical output of a VCSEL by scattering and reflection of the light emitted by the VCSEL.

BACKGROUND OF THE INVENTION

VCSELs have become preferred in today's optoelectronics industry because they are efficient, small in size, readily assembled into arrays, and easy to manufacture. Furthermore, VCSELs are exceptionally reliable due to good VCSEL-to-VCSEL uniformity, and they require less power to drive their lasing action. Within optical communication systems utilizing VCSELs, it is important to control the optical data signal being transmitted. Because the VCSELs which are commonly used in today's optoelectronics industry emit a unidirectional light beam normal to the surface in which they are formed, it is especially difficult to monitor the output optical power of the VCSEL without attenuating or otherwise compromising the integrity of the light emitted. Logically, in order to control the output optical power of a VCSEL and to maintain the optical power at a desired level, the output optical power must be monitored. Based on the monitored output optical power, adjustments can be made to the current signals supplied to the VCSEL to control the output optical power of the VCSEL. It is therefore desirable to accurately monitor the amount of light being emitted by a VCSEL at any given time.

SUMMARY OF THE INVENTION

The present invention provides an apparatus and method for directing a portion of the light emitted by a laser, onto a photodetector. The laser is coupled to an optical transmission medium such as an optical fiber and the majority of emitted light is preferably and advantageously transmitted to the optical fiber. This is preferably done without substantially attenuating or otherwise compromising the amount of emitted light that reaches the optical fiber. The present invention provides for directing a portion of the emitted light onto the detecting surface of the photodetector.

According to one exemplary embodiment, the laser is coupled to an optical transmission medium such as an optical fiber by means of a coupling medium that includes scattering elements chosen so that a portion of the light emitted from the laser is scattered and directed onto the detecting surface of a photodetector. An integrating member may optionally be added to collect light which is scattered out of the coupling medium and preferably to direct this light to the photodetector.

According to a second exemplary embodiment, an optical fiber is secured within a fiber optic ferrule. The optical fiber ferrule includes an end surface aligned facing the laser that is roughened to backscatter some of the light emitted from the laser, toward a monitoring photodetector. The photodetector is positioned to capture an amount of the scattered light.

According to a third exemplary embodiment, the end surface of the fiber optic ferrule facing the laser includes a reflective surface which is shaped to reflect a portion of the emitted light onto the monitoring photodetector.

BRIEF DESCRIPTION OF THE DRAWINGS

The present invention is best understood from the following detailed description when read in conjunction with the accompanying drawing. It is emphasized that, according to common practice, the various features of the drawings are not to-scale. On the contrary, the dimensions of the various features are arbitrarily expanded or reduced for clarity. Included in the drawings are the following figures.

Like elements denote like features throughout the specification and drawings.

DETAILED DESCRIPTION OF THE INVENTION

Figure 1:
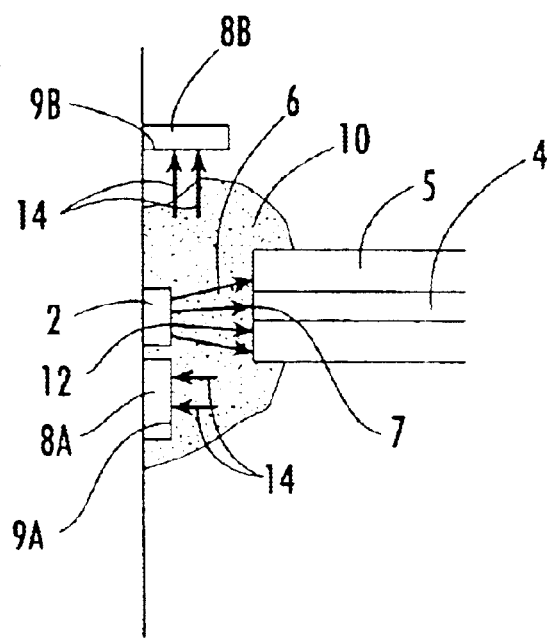
FIG. 1 is a cross-sectional view showing a VCSEL coupled to an optical fiber according to a first exemplary embodiment of the present invention.

According to each of the following exemplary embodiments, a photodetector such as a photodiode is used to absorb a portion of the light emitted from the laser. Any conventional photodiode or other suitable photodetectors such as PIN (P-type material/intrinsic layer/N-type material) photodiodes may be used. The photodiode or photodetector is preferably chosen in conjunction with the wavelength of light to be detected. As will be shown, the photodiode or photodetector is arranged to detect a portion of the emitted light by absorbing it on its detecting, or absorbing surface. Other photodetectors that sense light in other manners and that include detecting surfaces other than absorbing surfaces, may be used alternatively. Hereinafter, photodiodes and other photodetectors will be collectively referred to as photodetectors, and the detecting surface will be referred to as the absorbing surface.

According to each of the following exemplary embodiments, VCSELs that emit light at any of various wavelengths may be used as the source of emitted light and may therefore be monitored according to the present invention. Long wavelength (>1200 nm) and short wavelength VCSELs may be used. Furthermore, other lasers, such as edge-emitting lasers, may alternatively be used as the source of emitted light according to the present invention. Hereinafter, the source of emitted light will be referred to as a VCSEL, although it should be understood that other light sources such as edge-emitting lasers may be used alternatively.

According to each exemplary embodiment, the portion of emitted light absorbed by the photodetector is known to represent an approximate percentage of the total amount of light emitted by the VCSEL. This percentage may be determined experimentally using various suitable and conventional means. In this manner, the actual, total optical power emitted from the VCSEL can be approximated using the light detected by the photodetector. When the intensity of light detected by the photodetector changes, the total amount of light emitted by the VCSEL is then known to have changed accordingly. Generally speaking, the intensity of light detected by the photodetector may be considered to be the amount of light that reaches the absorbing surface of the photodetector. In response to the detected change in power of the light emitted from the VCSEL, various conventional electrical circuits, laser control methods and feedback techniques are known in the art and may be used to adjust the input current fed to the VCSEL in order to adjust the optical power level of the light emitted from the VCSEL and to maintain the power of emitted light at a desired level. Electrical circuitry may be electrically coupled to each of the photodetectors and various laser control means. In an exemplary embodiment, the laser control means includes a computer, processor, or other conventional control circuitry. The laser control means is capable of adjusting the amount of light emitted by the VCSEL.

According to each of the following exemplary embodiments, the VCSEL/optical fiber arrangement is preferably coupled such that the majority of the light emitted by the VCSEL is coupled into the optical fiber. In a preferred embodiment, at least ninety percent of the light emitted by the VCSEL is directed to the optical fiber, but other percentages of emitted light may reach the optical fiber according to other exemplary embodiments. Factors that may be considered include, for example, the coupling efficiency between the VCSEL and fiber, the sensitivity of the photodetector, and any other conventional factors known in the art. The underlying desire is to maintain both a suitable coupling efficiency into the fiber and enough light to the photodetector to provide a meaningful feedback signal. The optical fiber advantageously includes a core section, along which light propagates. The light that is not directed into the optical fiber, is the subject of the present invention and is monitored to provide information on the overall power of the light emitted by the VCSEL. The light monitoring elements of the present invention are chosen so that the light detected by the photodetector preferably increases monotonically as does the light output of the VCSEL. According to a preferred embodiment, the light detected by the photodetector increases linearly with the light output of the VCSEL.

Scattering from an Epoxy

According to this first exemplary embodiment, the VCSEL is butt-coupled to an optical fiber or other optical transmission medium. For brevity, such optical transmission media will be referred to collectively as optical fibers throughout the application, although other optical transmission media may be used alternatively. The VCSEL is preferably butt-coupled to the optical fiber without a lens, according to the configuration shown in FIG. 1. According to another exemplary embodiment, a collimating lens may be included between the VCSEL and the optical fiber. Optical fiber 4 extends along the direction of the light emitted from VCSEL 2, and therefore normal to emitting surface 12 of VCSEL 2. Emitting surface 12 may be considered the surface of the substrate in which the VCSEL is formed. VCSEL 2 is butt-coupled to end 7 of optical fiber 4 which is secured within fiber optic ferrule 5, by means of a fillet of coupling medium 10. Additional mechanical support may additionally be used to support and position the components. Coupling medium 10 may be a UV-curable or other epoxy or it may be another adhesive material. According to another exemplary embodiment, coupling medium 10 may be an index-matching gel. The index-matching gel preferably has a refractive index that is close to the refractive index of optical fiber 4. The index-matching gel may be an adhesive or non-adhesive material, and various mechanical means may be used to couple VCSEL 2 to optical fiber 4. Such an index-matching gel may be a curable material and is preferably a material chosen to avoid absorption, scattering and refraction of light of the wavelength in question. According to another exemplary embodiment, the index-matching gel may be formulated for partial scattering. Coupling medium 10 is disposed between, and contacts each of, VCSEL and the optical fiber 4/ferrule 5 arrangement in the exemplary embodiment. Coupling medium 10 is preferably chosen to be transmissive to the wavelength of light emitted by the VCSEL.

VCSEL 2 emits emitted light 6 along a direction generally normal to emitting surface 12. VCSEL 2 may be coupled to laser control means which may also be electrically coupled to a photodetector. Emitted light 6 is generally transmitted towards optical fiber 4 and the majority of this emitted light preferably reaches optical fiber 4. However, emitted light 6 may not be perfectly collimated, as can be seen. When VCSEL 2 is powered, some of emitted light 6 is scattered by scattering elements within coupling medium 10. Coupling medium 10 is formulated to include impurities or scattering elements incorporated therein. The scattering elements are elements which include a different refractive index than coupling medium 10 and therefore cause light to be scattered. Coupling medium 10 which may be a uv-curable epoxy which contains scattering elements, may be referred to as a thixotropic UV-curable epoxy. An example of such a thixotropic UV-curable epoxy is OG-142 made by Epoxy Technology, Inc. Other exemplary coupling media include RF or thermally-cured epoxies such as 353 ND manufactured by Epoxy Technology, Inc.

The impurities or scattering elements are chosen, and the concentration of the scattering elements within coupling medium 10 is established, so that a sufficient amount of emitted light 6 is scattered toward a monitoring photodetector without detrimentally affecting the amount of emitted light 6 which is transmitted from VCSEL 2 to optical fiber 4 and needed to produce a suitable data signal. The scattering elements may be glass particles, $Al_2O_3$ (aluminum oxide) particles, or $CeO_2$ (cerium oxide) particles but other scattering elements may be used alternatively. Portions of the emitted light that strike the scattering elements are scattered as scattered light 14. Several variables influence the ratio of: [light scattered onto photodetector:emitted light], which can be pre-determined and/or determined experimentally. These variables include, for example, the type of epoxy or other coupling medium, the nature and concentration of scattering impurities within the epoxy or other coupling medium, the coupling distance between the VCSEL and the optical fiber, the position of the photodetector, and others. Once the preceding ratio is established as a baseline, the total optical power of light emitted from the VCSEL can be determined based upon the light absorbed by the photodetector.

A portion of scattered light 14 reaches the surface of a photodetector where it is absorbed according to an exemplary embodiment. The amount of light reaching the absorbing surface of the photodetector may be considered the intensity of light at the photodetector surface. The absorbed light is detected by the photodetector which is coupled to electrical circuitry (not shown). The photodetector, together with the electrical circuitry, develops an electrical signal based on the amount of detected light. The light which reaches the photodetector surface is thereby converted into electrical signals which can be forwarded to laser control means which may include a computer and/or additional laser control circuitry and is capable of controlling parameters which affect the amount of light the laser emits, i.e. the optical power. The strength of the electrical signal, based on light reaching the absorbing surface of the photodetector, increases as does the intensity, or amount of light. If the monitored optical power level of the VCSEL is not the desired level, the conventional laser control may be then used to vary the optical power of the VCSEL. Two such exemplary photodetectors are shown in FIG. 1, although it should be understood that, typically, only one photodetector is used to detect light according to most exemplary embodiments. Photodetector 8A includes absorbing surface 9A, which is positioned generally parallel to emitting surface 12 of VCSEL 2. A portion of scattered light 14 impinges upon absorbing surface 9A and is absorbed and thereby detected by photodetector 8A. According to another exemplary embodiment, photodetector 8B includes absorbing surface 9B oriented generally orthogonal to emitting surface 12 of VCSEL 2. A portion of scattered light 14 impinges upon absorbing surface 9B and is detected by photodetector 8B. Photodetectors 8A and 8B are secured in position using conventional means. It should be understood that the orientations shown in FIG. 1 are exemplary only and that any of various photodetector orientations can be used alternatively.

Figure 2:
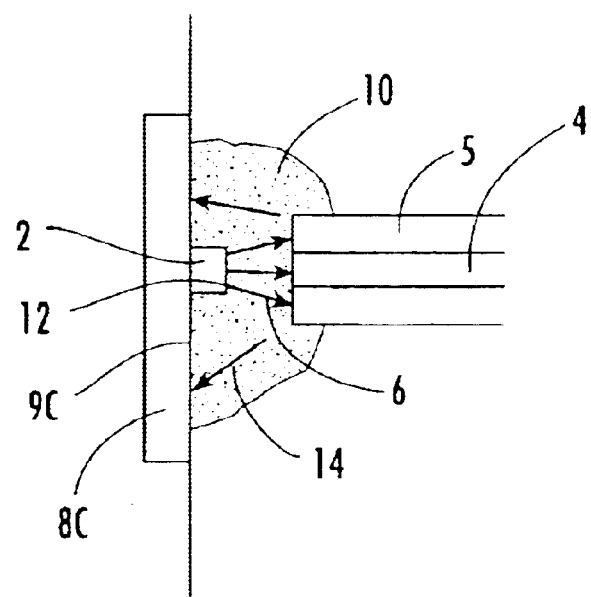
FIG. 2 is a cross-sectional view showing a VCSEL coupled to an optical fiber according to a second exemplary embodiment of the present invention.

For example, in the exemplary embodiment shown in FIG. 2, photodetector 8C is mounted opposite emitting surface 12 of VCSEL 2 and therefore behind VCSEL 2. Photodetector 8C includes a larger absorbing surface 9C so that a greater amount of scattered light 14 impinges upon absorbing surface 9C.

Figure 3:
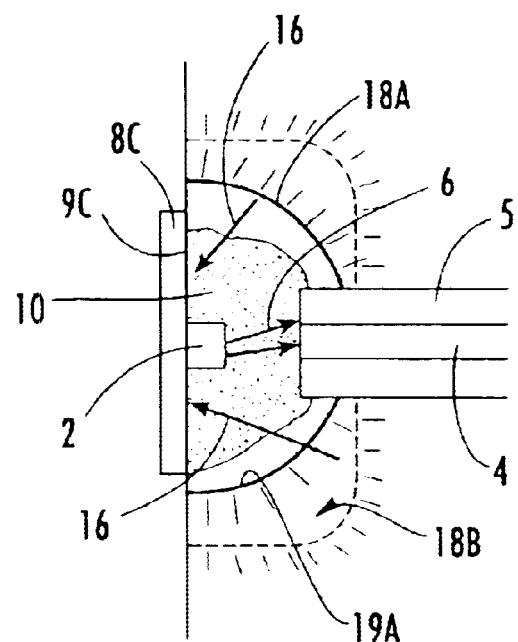
FIG. 3 is a cross-sectional view showing a VCSEL coupled to an optical fiber according to a third exemplary embodiment of the present invention.

According to another exemplary embodiment shown in FIG. 3, VCSEL 2 is butt-coupled to optical fiber 4 by means of a fillet of epoxy or other coupling medium 10 which includes scattering elements, and the apparatus further includes an integrating member to increase the efficiency of the configuration. The integrating member may be an enclosure which surrounds the fillet of epoxy 10 and reflects any light which may have been scattered out of the epoxy and not directed towards the photodetector, back into the epoxy where it may be further scattered and detected by the photodetector. The integrating member, such as integrating enclosures 18A and 18B shown in FIG. 3, surrounds the butt-coupled region as shown in FIG. 3 and may additionally reflect light directly toward the photodetector. The integrating member may be peripherally disposed about the outer surface of ferrule 5 or it may surround the fillet of coupling medium 10 and enclose the end of ferrule 5 and the fillet of coupling medium 10. The integrating member may take on different shapes. For example, hemispherical integrating enclosure 18A represents one exemplary embodiment of an integrating member and generally concave integrating enclosure 18B represents another. Integrating enclosure 18B is shown as a dashed line to indicate that only one integrating enclosure is used and that integrating enclosures 18A and 18B represent alternative embodiments of integrating enclosure configurations. According to various other exemplary embodiments, the integrating enclosure may take on other shapes, such as having a generally orthogonal shape.

The integrating member, such as integrating enclosure 18A, includes an internal surface, such as corresponding internal surface 19A, which is highly reflective. For example, the integrating member may be a metal sleeve which encloses the region where the VCSEL 2 is coupled to the optical fiber 4/ferrule 5 arrangement. Exemplary internal reflecting surface 19A may be formed of polished stainless steel, it may be gold-plated, or any of various other highly reflective materials such as other metals, can be used to form internal reflecting surface 19A. Some of the light which escapes coupling medium 10 may be redirected as reflected light 16 onto absorbing surface 9C of photodetector 8C. This embodiment preferably minimizes the amount of emitted light that is lost and therefore not sensed by a photodetector.

In each of the above exemplary embodiments which utilize the scattering coupling medium, the scattering coupling medium is preferably formulated so that substantially all of the emitted light which would otherwise reach optical fiber 4, still reaches optical fiber 4. Some of the diverging light which spreads out and would not reach optical fiber 4, is scattered or reflected according to this embodiment, enabling it to reach the photodetector. The amount of light scattered away from optical fiber 4 by the scattering elements will desirably be the same as the amount of light scattered towards optical fiber 4. Also in each of the above exemplary embodiments, the photodetector may be placed anywhere with respect to the VCSEL and fiber to maximize absorption of the reflected/scattered light.

Scattering from Fiber Optic Ferrule and Optical Fiber

Figure 4:
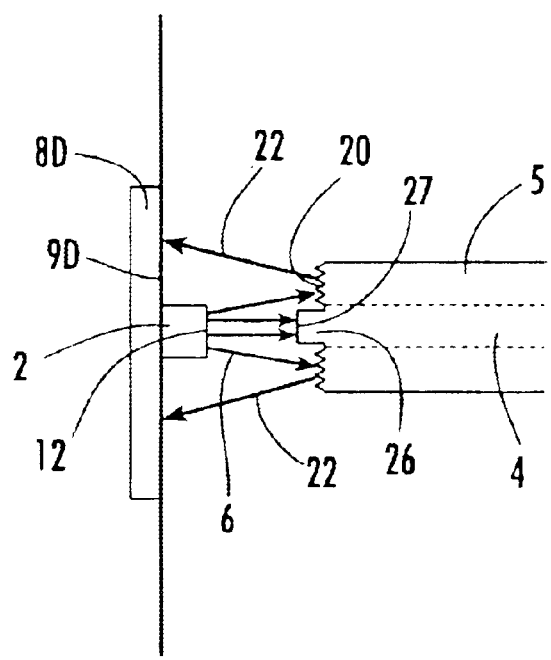
FIG. 4 is a cross-sectional view showing a VCSEL coupled to an optical fiber according to a fourth exemplary embodiment of the present invention.

FIG. 4 shows VCSEL 2 butt-coupled to fiber optic ferrule 5 which contains optical fiber 4 along its center axis. Various suitable and conventional mechanical elements may be used to secure the components into position. The components are preferably coupled without using a lens. In an exemplary embodiment, fiber optic ferrule 5 may be formed of zirconium, but other conventional materials such as ceramic, metal, or glass that are used to form fiber optic ferrules, may be used alternatively. The end surface of fiber optic ferrule 5, which faces emitting surface 12 of VCSEL 2 is roughened to form rough surface 20. Conventional methods can be used to scratch or abrade the end face, or end surface, of fiber optic ferrule 5 to produce rough surface 20. Fiber optic ferrule 5 contains optical fiber 4 which, in an exemplary embodiment, may include end 26 which extends out of fiber optic ferrule 5 and is in closer proximity to VCSEL 2 than rough surface 20. Other configurations may be used alternatively. U.S. Pat. No. 5,668,902 to Kurata, the contents of which are herein incorporated by reference, discloses a technique for coupling an optical fiber to a semiconductor laser such as a VCSEL, without a lens, and also provides a method for scratching or otherwise abrading the end face of the optical fiber to reduce light reflected from the end face of the optical fiber from coupling back into the semiconductor laser. Such methods may be used to abrade the end surface of fiber optic ferrule 5 to produce rough surface 20, but other techniques may be used alternatively. According to another exemplary embodiment, end face 27 of optical fiber 4 may additionally or alternatively be abraded to form a rough surface which scatters light for monitoring.

When VCSEL 2 is powered to emit light, the majority of light desirably reaches and is transmitted along optical fiber 4. Not all of emitted light 6 reaches optical fiber 4, however, and a portion of emitted light 6 impinges upon rough surface 20 of ferrule 5. At least a portion of the light which impinges upon rough surface 20 is backscattered in various directions, including toward a photodetector, such as photodetector 8D. In this manner, some of backscattered light 22 impinges upon absorbing surface 9D, enabling photodetector 8D to detect backscattered light 22. According to the exemplary embodiment in which end face 27 is roughened, a portion of light which impinges upon end face 27 is backscattered toward photodetector 8D. Conventional experimental and other methods can be used to predetermine the portion of emitted light 6 which reaches photodetector 8D as backscattered light 22. In this manner, the total optical power of VCSEL 2 and the changes therein can be approximated by the light detected by photodetector 8D.

According to another exemplary embodiment, an integrating member such as integrating enclosure 18A or 18B shown in FIG. 3, may be added to this arrangement including rough surface 20 formed of the end face of optical fiber ferrule 5. The integrating member directs light towards the photodetector absorbing surface 9D. The optional addition of an integrating member increases the efficiency of the configuration and minimizes the amount of backscattered light which is not directed onto an absorbing surface of a photodetector and therefore lost. The relative arrangement of VCSEL 2 and photodetector 8D is intended to be exemplary only and various other configurations may be used in other exemplary embodiments. In each of the above exemplary embodiments, the photodetector may be placed anywhere with respect to the VCSEL and fiber to maximize absorption of the reflected/scattered light Furthermore, it should be understood that any of various conventional means for physically securing the components into place can be used.

The light directed toward and detected by the photodetector may then be converted to an electrical signal by the photodetector and electrical circuitry to which the photodetector is coupled. The light which reaches the photodetector surface is thereby converted into electrical signals which can be forwarded to a laser control circuit including laser control means capable of controlling and adjusting the VCSEL based on the electrical signal. The strength of the electrical signal, based on light reaching the absorbing surface of the photodetector, increases as does the intensity or amount of light. The laser control circuit may include a computer, processor or other suitable circuitry to analyze the electrical signal, and may be used to adjust the optical power of the VCSEL, if warranted.

Reflection from Fiber Optic Ferrule

Figure 5:
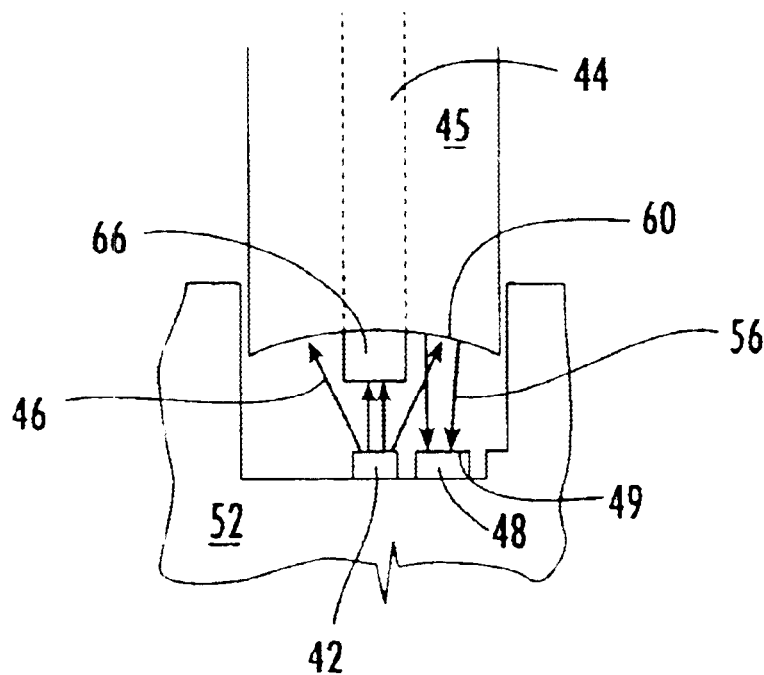
FIG. 5 is a cross-sectional view showing a VCSEL coupled to an optical fiber according to a fifth exemplary embodiment of the present invention.

FIG. 5 shows fiber optic ferrule 45, which includes optical fiber 44 and is coupled to optical subassembly 52, which includes VCSEL 42 and photodetector 48. The components may be secured into position using various mechanical means. Photodetector 48 includes absorbing surface 49. End 66 of optical fiber 44 protrudes from end surface 60 of fiber optical ferrule 45 and is in closer proximity to VCSEL 42 than is end surface 60. Other configurations may be used according to other exemplary embodiments. End surface 60 is polished and contoured so that portions of emitted light 46 which are not directly coupled into optical fiber 44, are reflected from end surface 60 and directed back as reflected light 56 onto absorbing surface 49 of photodetector 48. Fiber optic ferrule 45 may be formed of zirconia, ceramic, metal, or other conventional materials. End surface 60 may be polished and/or coated with a highly reflective coating optimized for reflecting the wavelength of light emitted by the VCSEL. Examples of such highly reflective coatings include multiple, quarter wavelength layers of magnesium fluoride and aluminum fluoride, and metals such as gold. End surface 60 may preferably be concave or convex in shape, but other configurations may be used alternatively depending on the position of the photodetector used. Conventional polishing, coating and contouring operations may be used. Optical subassembly (OSA) 52 may be a ceramic substrate according to an exemplary embodiment. Fiber optic ferrule 45 may be secured within a housing (not shown) which is coupled to OSA 52 to form a two-piece OSA. According to another exemplary embodiment in which VCSEL 42 and photodetector 48 are not contained within an OSA configured such as OSA 52, an integrating member, such as one of the integrating enclosures shown in FIG. 3, may be used to surround the coupled region to minimize the amount of light which is lost and not reflected onto absorbing surface 49 of photodetector 48.

The OSA/housing arrangement may take on other configurations and may also be used in conjunction with the other exemplary embodiments described herein.

Figure 6:
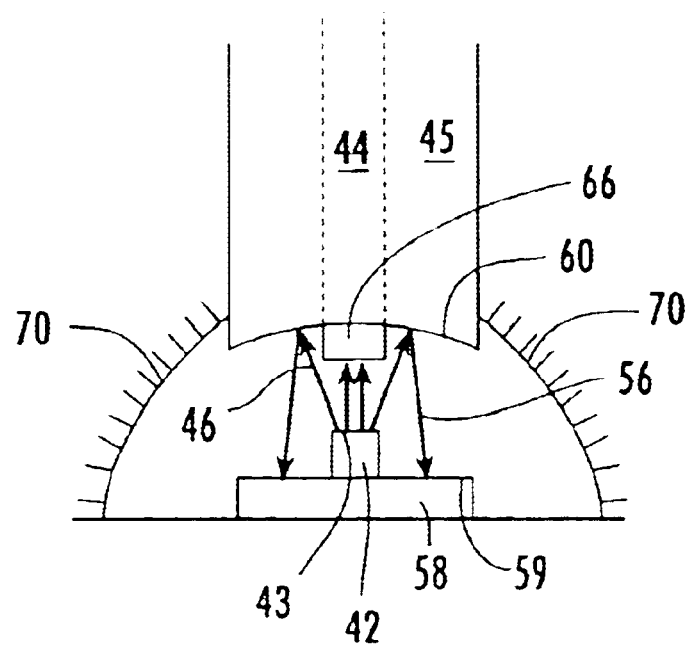
FIG. 6 is a cross-sectional view showing a VCSEL coupled to an optical fiber according to a sixth exemplary embodiment of the present invention.

According to another exemplary arrangement of the embodiment utilizing a reflective end face of a fiber optic ferrule, FIG. 6 shows an arrangement in which photodetector 58, including absorbing surface 59, is disposed beneath VCSEL 42. Emitting surface 43 of VCSEL 42 is preferably substantially parallel to absorbing surface 59. The larger absorbing surface increases the efficiency of the photodetector as more of the reflected light can be absorbed. FIG. 6 also includes integrating enclosure 70, which includes an internal reflective surface as discussed in conjunction with FIG. 3. The reflection from the fiber optic ferrule embodiment is applicable to multimode and single mode fibers. In each of the above exemplary embodiments, the photodetector may be placed anywhere with respect to the VCSEL and fiber to maximize absorption of the reflected light.

According to the exemplary embodiments in which reflection from the end face of the fiber optic ferrule is used, a portion of emitted light is directed to a detecting surface of a photodetector and the photodetector is advantageously coupled to electrical circuitry. The portion of light is representative of the total optical power of the VCSEL. The light which reaches the absorbing surface is converted to an electrical signal by the photodetector in conjunction with the electrical circuitry. The strength of the electrical signal increases, as does the intensity or amount of absorbed light. Laser control circuitry, coupled to the electrical circuitry, may then be used to vary the optical power of the VCSEL, if warranted. A computer, processor, or other circuitry may be included to analyze the electrical signal, compare it to a desired optical power, and provide feedback to the laser control.

VCSEL Arrays

Figure 7:
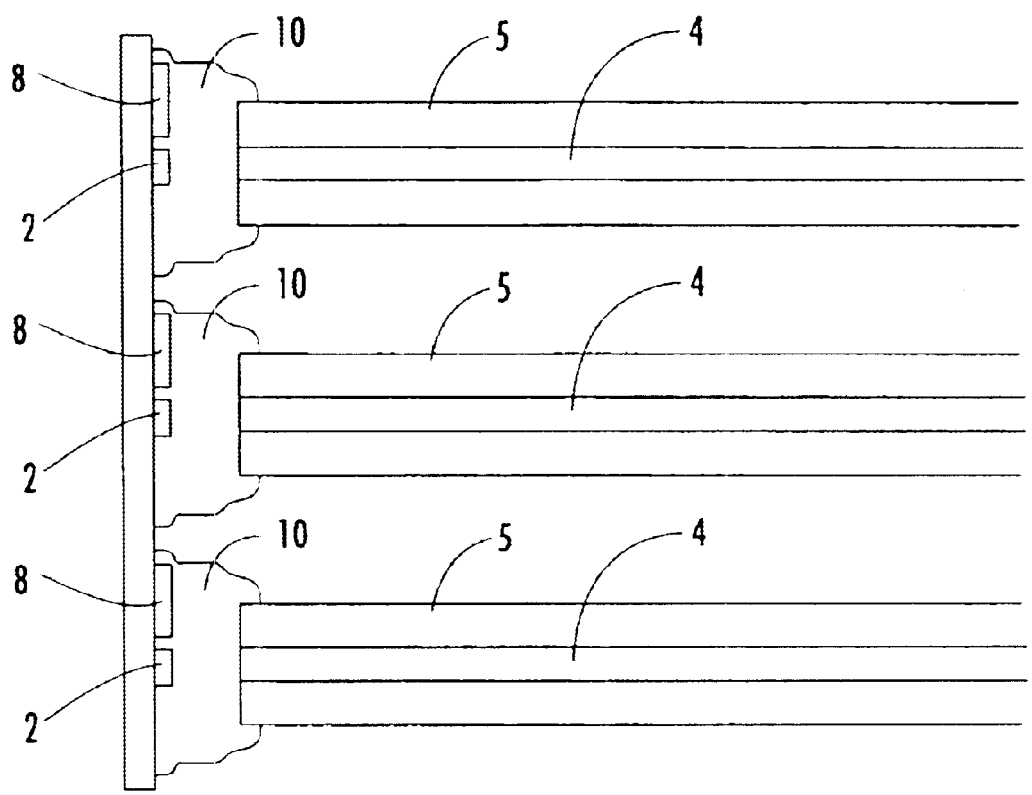
FIG. 7 is a cross-sectional view of an array of VCSELs coupled to optical fibers according to the present invention.

The various exemplary embodiments of the present invention also find application in arrays of VCSELs. FIG. 7 is a cross-sectional view of an array of VCSELs 2 which are coupled to the optical fiber 4/optical ferrule 5 arrangement by means of coupling medium 10. Coupling medium 10 includes scattering elements therein and is as described above. Each of the VCSEL 2/optical fiber 4 arrangements may additionally include an integrating member. Each of the exemplary embodiments of the fiber optical ferrule having a rough end surface, and the optical ferrule having a reflective end surface, may also be arranged in arrays. The linear array of three VCSELs is intended to be exemplary only and other array configurations may be used alternatively. The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. For example, the various features shown and described in the various exemplary embodiments may be combined in other arrangements. The configuration of elements shown may also be varied. Furthermore, the relative dimensions of the components may also be varied. The scope of the present invention is best illustrated by the claims.

What is claimed is:

1. A laser module comprising:
   a laser having an optical axis;
   a photodetector arranged adjacent to said laser;
   an optical fiber disposed in spaced relation with said laser and aligned with said optical axis of said laser, said optical fiber having a receiving portion thereof configured and arranged to receive light emitted by said laser;
   transparent coupling medium substantially entirely surrounding and filling said space between said laser, said photodetector, and said receiving portion of said optical fiber, wherein said laser, said photodetector and said receiving portion of said optical fiber are embedded in said coupling medium; and
   a plurality of scattering elements uniformly dispersed throughout said coupling medium capable of scattering a pro-determined detectable portion of said light emitted by said laser toward said photodetector, said portion sufficient for monitoring the level of light emitted.

2. The laser module of claim 1, wherein said laser comprises a vertical cavity surface emitting laser (VCSEL).

3. The laser module of claim 2, wherein an emitting surface of said VCSEL is positioned substantially parallel to a detecting surface of said photodetector.

4. The laser module of claim 1, wherein said coupling medium comprises an epoxy.

5. The laser module of claim 1, wherein said coupling medium comprises an index matching gel.

6. The laser module of claim 1 further comprising:
   an integrating enclosure substantially surrounding said coupling medium.

7. The laser module of claim 6 wherein said integrating enclosure includes an internal reflective surface.

8. The laser module of claim 2 further comprising:
   an integrating enclosure substantially surrounding said coupling medium.

9. The laser module of claim 8 wherein said integrating enclosure includes an internal reflective surface.

10. The laser module of claim 1 wherein said scattering elements each have a refractive index which is different than a refractive index of said coupling medium.

11. The laser module of claim 1 wherein said scattering elements comprise glass particles.

12. The laser module of claim 1 wherein said scattering elements comprise at least one of $AL_2O_3$ and $CeO_2$ particles.

13. The laser module of claim 2 wherein said scattering elements each have a refractive index which is different than a refractive index of said coupling medium.

14. The laser module of claim 6 wherein said scattering elements each have a refractive index which is different than a refractive index of said coupling medium.

15. The laser module of claim 8 wherein said scattering elements each have a refractive index which different than a refractive index of said coupling medium.

16. The laser module of claim 1 further comprising: p1 a laser control device In electrical communication with said laser and said photodetector, said photodetector developing an electrical detector signal responsive to scattered light received on a detecting surface thereof and providing said electrical detector signal to said laser control device, said laser control device being configured to develop a corresponding laser control signal and to provide said laser control signal to said laser responsive to said electrical detector signal.

17. The laser module of claim 15 further comprising:
   a laser control device in electrical communication with said laser and said photodetector, said photodetector developing an electrical detector signal responsive to scattered light received on a detecting surface thereof and providing said electrical detector signal to said laser control device, said laser control device being configured to develop a corresponding laser control signal and to provide said laser control signal to said laser responsive to said electrical detector signal.

18. A laser module comprising:
   a laser having an optical axis;
   a photodetector arranged adjacent to said laser;
   an optical fiber having a light receiving end and further having an optical axis, said optical fiber being configured and arranged in spaced coaxial alignment with said optical axis of said laser, wherein light emitted by said laser is coupled into said light receiving end of said optical fiber;
   a transparent coupling medium surrounding and filling said space between said laser, said photodetector, and said receiving end of said optical fiber, wherein said laser, said photodetector and said receiving portion of said optical fiber are embedded in said coupling medium; and
   a plurality of scattering elements uniformly dispersed throughout said coupling medium such that a pre-determined detectable portion of said light emitted by said laser is scattered within said coupling medium arid directed toward said photodetector.

19. The laser module of claim 18, wherein said laser comprises a vertical cavity surface emitting laser (VCSEL).

20. The laser module of claim 19, wherein an emitting surface of said VCSEL is positioned substantially parallel to a detecting surface of said photodetector.

21. The laser module of claim 18, wherein said coupling medium comprises an epoxy.

22. The laser module of claim 18, wherein said coupling medium comprises an index matching gel.

23. The laser module of claim 18 further comprising:
   an integrating enclosure substantially surrounding said coupling medium.

24. The laser module of claim 23 wherein said integrating enclosure includes an internal reflective surface.

25. The laser module of claim 19 further comprising:
   an integrating enclosure substantially surrounding said coupling medium.

26. The laser module of claim 25 wherein said integrating enclosure includes an internal reflective surface.

27. The laser module of claim 18 wherein said scattering elements each have a refractive index which is different than a refractive index of said coupling medium.

28. The laser module of claim 18 wherein said seattering elements comprise glass particles.

29. The laser module of claim 18 wherein said scattering elements comprise at least one of $AL_2O_3$ and $CeO_2$ particles.

30. The laser module of claim 19 wherein said scattering elements each have a refractive index which is different than a refractive index of said coupling medium.

31. The laser module of claim 23 wherein said scattering elements each have a refractive index which is different than a refractive index of said coupling medium.

32. The laser module of claim 24 wherein said scattering elements each have a refractive index which is different than a refractive index of said coupling medium.

33. The laser module of claim 18 further comprising:

a laser control device in electrical communication with said laser and said photodetector, said photodetector developing an electrical detector signal responsive to scattered light received on a detecting surface thereof and providing said electrical detector signal to said laser control device, said laser control device being configured to develop a corresponding laser control signal and to provide said laser control signal to said laser responsive to said electrical detector signal.

34. The laser module of claim 32 further comprising:

a laser control device in electrical communication with said laser and said photodetector, said photodetector developing an electrical detector signal responsive to scattered light received on a detecting surface thereof and providing said electrical detector signal to said laser control device, said laser control device being configured to develop a corresponding laser control signal and to provide said laser control signal to said laser responsive to said electrical detector signal.

35. A laser module comprising:

a laser having an optical axis;

a photodetector arranged adjacent to said laser;

an optical fiber assembly comprising an optical fiber portion having an optical axis and a ferrule portion coaxially surrounding said optical fiber, said optical fiber portion being configured and arranged in alignment with said optical axis of said laser wherein light emitted by said laser is coupled into said light receiving end of said optical fiber assembly, said ferrule portion having a light receiving end surface facing said laser, said end surface being configured to direct a portion of said light emitted from said laser onto said photodetector.

36. The laser module of claim 35 wherein said end surface of said ferrule portion is a concave surfaced configured to direct light towards said photodetector.

37. The laser module of claim 36 wherein said concave end surface of said ferrule portion is reflective.

38. The laser module of claim 35 wherein said end surface of said ferrule portion is a rough surface configured to backscatter light toward said photodetector.

39. The laser module of claim 38 wherein an end surface of said optical fiber portion extends beyond said end surface of said ferrule portion.

40. The laser module of claim 35 wherein said laser comprises a vertical cavity surface emitting laser.

41. The laser module of claim 40 wherein an emitting surface of said VCSEL is positioned substantially parallel to a detecting surface of said photodetector.

42. The laser module of claim 35 further comprising:

a laser control device in electrical communication with said laser and said photodetector, said photodetector developing an electrical detector signal responsive to scattered light received on a detecting surface thereof and providing said electrical detector signal to said laser control device, said laser control device being configured to develop a corresponding laser control signal and to provide said laser control signal to said laser responsive to said electrical detector signal.

43. The laser module of claim 35 comprising:

an integrating enclosure disposed peripheral to said optical fiber assembly, said integrating enclosure being configured to reflect light emitted from said laser towards said photodetector.

44. The laser module of claim 43 wherein said integrating enclosure includes an internal reflective surface.

* * * * *